US012764852B2

(12) United States Patent

Chen et al.

(10) Patent No.: US 12,764,852 B2
(45) Date of Patent: Oct. 13, 2026

(54) SHIELD AND ELECTRONIC ASSEMBLY

(71) Applicant: AMLOGIC (SHANGHAI) CO., LTD, Shanghai (CN)

(72) Inventors: Siwei Chen, Shanghai (CN); Kun Zhang, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 106 days.

(21) Appl. No.: 18/832,657

(22) PCT Filed: Aug. 30, 2022

(86) PCT No.: PCT/CN2022/115933
§ 371 (c)(1),
(2) Date: Jul. 24, 2024

(87) PCT Pub. No.: WO2023/142477
PCT Pub. Date: Aug. 3, 2023

(65) Prior Publication Data

US 2025/0168967 A1 May 22, 2025

(30) Foreign Application Priority Data

Jan. 28, 2022 (CN) ......................... 202220242418.3

(51) Int. Cl.
*H05K 5/00* (2025.01)
*H05K 1/02* (2006.01)

(52) U.S. Cl.
CPC ......... *H05K 1/0216* (2013.01); *H05K 1/0203* (2013.01); *H05K 2201/0707* (2013.01); *H05K 2201/10371* (2013.01)

(58) Field of Classification Search
CPC ............... H05K 1/0216; H05K 1/0203; H05K 2201/0707; H05K 2201/10371
See application file for complete search history.

(56) References Cited

U.S. PATENT DOCUMENTS 10,658,901 B2 * 5/2020 Kinoshita ............... F04B 35/04
10,775,657 B2 * 9/2020 Inoue ................ G02F 1/133308
(Continued)

FOREIGN PATENT DOCUMENTS

CN 1449240 A 10/2003
CN 201504386 U 6/2010
(Continued)

OTHER PUBLICATIONS

International Search Report and Written Opinion received in International Application No. PCT/CN2022/115933, dated Oct. 17, 2022.

*Primary Examiner* — Allen L Parker
*Assistant Examiner* — Rashen E Morrison
(74) *Attorney, Agent, or Firm* — Knobbe, Martens, Olson & Bear, LLP

(57) ABSTRACT

The present disclosure provides a shield and an electronic assembly. The electronic assembly comprises a base plate and a chip located on the base plate. According to the embodiments of the present disclosure, the shield is plate-shaped; in the shield, a first cover cap is connected to side walls around a second cover cap, the first cover cap is used for electromagnetic shielding around the chip, electromagnetic radiation is refracted multiple times on an inner surface of the first cover cap, energy of the electromagnetic radiation is lost during the refraction process, radiation energy of the electromagnetic radiation coupled to the first cover cap is reduced, and radiation energy radiated out of the first cover cap is reduced, such that an electromagnetic shielding effect of the shield is good; in addition, the second cover cap is closer to the chip than the first cover cap, and the second cover cap and the chip absorb heat generated by the chip; and because the first cover cap is connected to the second cover cap, the first cover cap can also absorb energy in the chip. In conclusion, the shield achieves not only the effect of (Continued)

heat radiation but also the effect of electromagnetic shielding, and is thus beneficial to reduce costs.

20 Claims, 1 Drawing Sheet

(56) References Cited

U.S. PATENT DOCUMENTS

| | | | | |
|---|---|---|---|---|
| 12,001,245 | B2 * | 6/2024 | Kishimoto | G06F 3/0412 |
| 12,204,379 | B2 * | 1/2025 | Jeon | G02B 1/14 |
| 2003/0223212 | A1 * | 12/2003 | Hosokawa | B41J 2/17596 361/816 |
| 2017/0367175 | A1 * | 12/2017 | Lai | G06F 1/1656 |
| 2021/0398911 | A1 | 12/2021 | Shen et al. | |

FOREIGN PATENT DOCUMENTS

| | | | | | |
|---|---|---|---|---|---|
| CN | 104486935 | A | | 4/2015 | |
| CN | 216905809 | U | | 7/2022 | |
| JP | 2017045931 | A | | 3/2017 | |
| KR | 20060087888 | A | * | 8/2006 | H05K 9/0028 |
| TW | 200928683 | A | | 7/2009 | |
| WO | WO-2022089366 | A1 | * | 5/2022 | H10W 76/40 |

* cited by examiner

SHIELD AND ELECTRONIC ASSEMBLY

TECHNICAL FIELD

Embodiments of the disclosure relate to the field of electromagnetic shielding, in particular to a shield and an electronic assembly.

BACKGROUND

With the rapid development of the electronic industry, electronic products or electrical appliances have become an indispensable part of our lives. For most electronic elements or systems, electromagnetic interference (EMI) is a severe and challenging issue. Since the electromagnetic interference often interrupts, degrades, or limits the effectiveness of all circuits in an electronic element or system, the electronic element or system requires effective protection against electromagnetic interference to ensure effective and safe operation. Electromagnetic interference protection is particularly important for small-sized and high-density packages or sensitive electronic elements that operate at high frequencies.

As the central processing unit (CPU), graphics processing unit (GPU) and double data rate synchronous dynamic random access memory (DDR) of electronic products such as smart TVs, set-top boxes or smart speakers keep increasing at operating frequency, systems become increasingly complicated, and the problem of electromagnetic interference (EMI) is aggravated.

Existing solutions to electromagnetic interference (EMI) typically include adding a shielding cover cap, adding wire shielding, or adding electromagnetic grounding points, but all of these measures result in higher equipment costs.

SUMMARY

Embodiments of the disclosure provide a shield and an electronic assembly, so as to solve the problem of electromagnetic interference at a low cost.

In order to solve the above problem, the embodiments of the disclosure provide a shield applied to an electronic assembly. The electronic assembly includes a base plate and a chip located on the base plate. The shield includes: a first cover cap configured to surround the chip for electromagnetic shielding; and a second cover cap, where peripheral sidewalls of the second cover cap are connected to the first cover cap, and the second cover cap protrudes from the surface of the first cover cap, such that the second cover cap is closer to the chip than the first cover cap in a normal direction of the base plate, and the second cover cap absorbs heat of the chip.

Optionally, a distance from a surface of the first cover cap close to the chip to a surface of the second cover cap close to the chip is 0.8 mm-2 mm.

Optionally, a surface of the first cover cap facing away from the chip is an undulating surface.

Optionally, a surface of the second cover cap facing away from the chip has a plurality of spaced fins.

Optionally, ends of the fins protrude from the surface of the first cover cap.

Optionally, a space between adjacent fins is 3 mm-6 mm.

Optionally, with a direction perpendicular to an extending direction of the fins as a lateral direction, lateral sizes of the fins gradually decrease in a direction away from the second cover cap.

Optionally, the first cover cap is a flat plate, and distances from all portions of a bottom of the first cover cap to a bottom of the second cover cap are the same; and alternatively, the first cover cap is an undulating plate, and distances from all portions of a bottom of the first cover cap to a bottom of the second cover cap are different.

Optionally, the second cover cap is square, rectangular or circular, and the first cover cap is located on a sidewall of a top of the second cover cap.

Optionally, a plurality of chips are provided on the base plate; and a plurality of second cover caps of the shield are provided.

Correspondingly, the disclosure further provides an electronic assembly. The electronic assembly includes: a base plate; a chip located on the base plate; and the shield located above the chip, where the first cover cap surrounds the chip, the second cover cap is located directly above the chip, and the second cover cap is closer to the chip than the first cover cap in a normal direction of the base plate.

Optionally, a projection of the second cover cap on the base plate overlays a projection of the chip on the base plate.

Optionally, the electronic assembly further includes a grounding structure located around the shield, where one end of the grounding structure is connected to a periphery of the shield, and the other end of the grounding structure is connected to the base plate.

Optionally, the electronic assembly further includes a fixing member penetrating an edge of the shield to fixedly connect the shield to the base plate.

Optionally, the second cover cap makes contact with a top of the chip.

Optionally, the electronic assembly further includes electronic elements located on the base plate and arranged on a side of the chip in a spaced manner, where the first cover cap cover caps the electronic elements and makes contact with tops of the electronic elements.

Compared with the prior art, the technical solution of the embodiments of the disclosure has the following advantages: the shield applied to an electronic assembly provided in the embodiments of the disclosure includes: a first cover cap configured to surround the chip for electromagnetic shielding; and a second cover cap, where peripheral sidewalls of the second cover cap are connected to the first cover cap, and the second cover cap protrudes from a surface of the first cover cap, such that the second cover cap is closer to the chip than the first cover cap in a normal direction of the base plate, and the second cover cap absorbs heat of the chip. In the embodiments of the disclosure, the first cover cap is connected to the peripheral sidewalls of the second cover cap, the first cover cap is configured to surround the chip for electromagnetic shielding, electromagnetic radiation is refracted on an inner surface of the first cover cap for a plurality of times, energy of the electromagnetic radiation is lost in a refraction process, radiation energy of electromagnetic radiation coupled to the first cover cap is reduced, and radiation energy radiated out of the first cover cap is reduced, such that an electromagnetic shielding effect of the shield is desirable. Furthermore, the second cover cap is closer to the chip than the first cover cap, the second cover cap and the chip to absorb heat generated by operation of the chip, and since the first cover cap is connected to the second cover cap, the first cover cap can also absorb energy in the chip correspondingly. In summary, the shield not only implements heat dissipation, but also performs electromagnetic shielding, which is conducive to reduction in cost.

In an optional solution, a distance from a surface of the first cover cap close to the chip to a surface of the second cover cap close to the chip is 0.8 mm-2 mm.

Since the distance from the surface of the first cover cap close to the chip to the surface of the second cover cap close to the chip is short, and the distance from the surface of the first cover cap close to the chip to the base plate is small correspondingly, such that the electromagnetic radiation is refracted more times on the surface of the first cover cap, more electromagnetic radiation is lost in a refraction process, the radiation energy of the electromagnetic radiation coupled to the first cover cap is reduced, and the radiation energy radiated out of the first cover cap is reduced, such that the electromagnetic shielding effect of the shield is desirable.

DETAILED DESCRIPTION

As can be seen from the background art, as the central processing unit (CPU), graphics processing unit (GPU) and double data rate synchronous dynamic random access memory (DDR) of electronic products such as smart TVs, set-top boxes or smart speakers keep increasing at operating frequency, systems become increasingly complicated, and the problem of electromagnetic interference (EMI) is aggravated.

In order to solve the above problem, a shielding apparatus provided in embodiments of the disclosure is applied to an electronic assembly. The electronic assembly includes a base plate and a chip located on the base plate. The shield includes: a first cover cap configured to surround the chip for electromagnetic shielding; and a second cover cap, where peripheral sidewalls of the second cover cap are connected to the first cover cap, and the second cover cap protrudes from a surface of the first cover cap, such that the second cover cap is closer to the chip than the first cover cap in a normal direction of the base plate, and the second cover cap absorbs heat of the chip.

In the embodiments of the disclosure, the first cover cap is connected to the peripheral sidewalls of the second cover cap, the first cover cap surrounds the chip for electromagnetic shielding, electromagnetic radiation is refracted on an inner surface of the first cover cap for a plurality of times, energy of the electromagnetic radiation is lost in a refraction process, radiation energy of electromagnetic radiation coupled to the first cover cap is reduced, and radiation energy radiated out of the first cover cap is reduced, such that an electromagnetic shielding effect of the shield is desirable. Furthermore, the second cover cap is closer to the chip than the first cover cap, the second cover cap and the chip absorb heat generated by operation of the chip, and since the first cover cap is connected to the second cover cap, the first cover cap can also absorb energy in the chip correspondingly. In summary, the shield not only implements heat dissipation, but also performs electromagnetic shielding, which is conducive to a reduction in cost.

Figure 1:
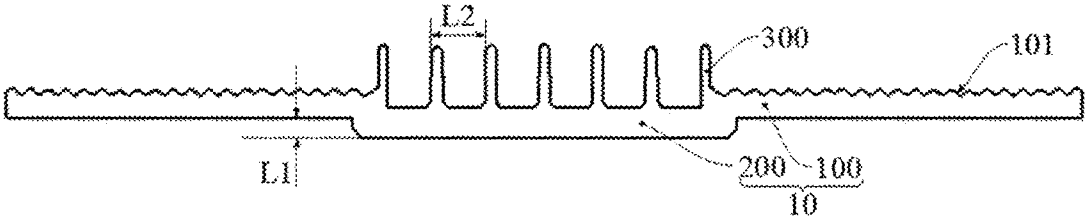
FIG. 1 is a schematic structural diagram of a shield according to an embodiment of the disclosure.
Figure 2:
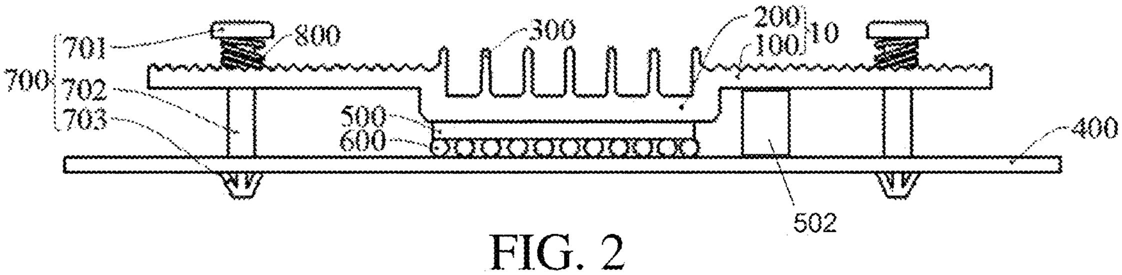
FIG. 2 is a schematic structural diagram of an electronic assembly according to an embodiment of the disclosure.
Figure 3:
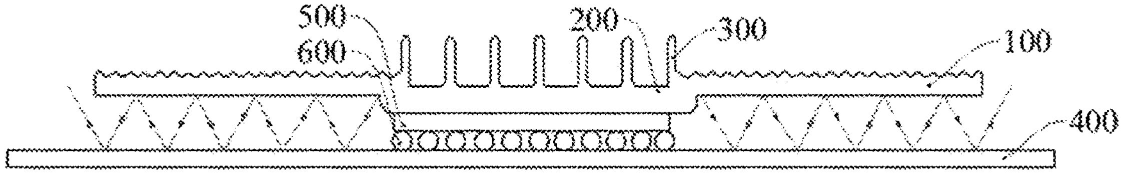
FIG. 3 is a schematic diagram of refraction of electromagnetic radiation in an electronic assembly according to an embodiment of the disclosure.

With reference to FIGS. 1-3, FIG. 1 is a schematic structural diagram of a shield according to an embodiment of the disclosure.

As shown in FIG. 1, a shield 10 applied to an electronic assembly is provided. The electronic assembly includes a base plate 400 (as shown in FIG. 2) and a chip 500 (as shown in FIG. 2) located on the base plate 400. The shield 10 is of a plate shape. The shield 10 includes: a first cover cap 100 configured to surround the chip 500 for electromagnetic shielding; and a second cover cap 200, where peripheral sidewalls of the second cover cap 200 are connected to the first cover cap 100, and the second cover cap 200 protrudes from a surface of the first cover cap 100, such that the second cover cap 200 is closer to the chip 500 than the first cover cap 100 in a normal direction of the base plate 400, and the second cover cap 200 absorbs heat of the chip 500.

In the embodiments of the disclosure, the first cover cap 100 is connected to the peripheral sidewalls of the second cover cap 200, the first cover cap 100 surrounds the chip 500 for electromagnetic shielding, electromagnetic radiation is refracted on an inner surface of the first cover cap 100 for a plurality of times, energy of the electromagnetic radiation is lost in a refraction process, radiation energy of electromagnetic radiation coupled to the first cover cap 100 is reduced, and radiation energy radiated out of the first cover cap 100 is reduced, such that an electromagnetic shielding effect of the shield 10 is desirable. Furthermore, the second cover cap 200 is closer to the chip 500 than the first cover cap 100, the second cover cap 200 makes contact with the chip 500 to absorb heat generated by operation of the chip 500, and since the first cover cap 100 is connected to the second cover cap 200, the first cover cap 100 can also absorb energy in the chip 500 correspondingly. In summary, the shield 10 not only implements heat dissipation, but also performs electromagnetic shielding, which is conducive to a reduction in cost.

The embodiments of the disclosure can perform electromagnetic shielding, thereby solving the problems that a working frequency point and frequency multiplication exceed standards and remaining working frequency points are insufficient during radiated emission.

In the embodiment, the second cover cap 200 is square, rectangular or circular. The first cover cap 100 is located on a sidewall of a top of the second cover cap 200.

In the embodiment, the first cover cap 100 is a flat plate, a bottom of the first cover cap 100 is located in a same plane, and distances from all portions of the bottom of the first cover cap 100 to a bottom of the second cover cap 200 are the same correspondingly. Therefore, the shield 10 has a simple structure and is easy to produce and manufacture. In other embodiments, the first cover cap may alternatively be an undulating plate. Portions of a bottom of the first cover cap are located in different planes, and distances from the portions the bottom of the first cover cap to a bottom of the second cover cap are different correspondingly, such that electronic elements of different heights mounted on the base plate are accommodated.

In the embodiment, the first cover cap 100 and the second cover cap 200 are of an integral structure. In other embodiments, the first cover cap and the second cover cap may of a detachable fitting structure.

The first cover cap 100 and the second cover cap 200 are made of metal materials with desirable thermal conductivity, such that the first cover cap 100 and the second cover cap 200 can act as electromagnetic shields and have excellent thermal conductivity, and can also quickly dissipate heat generated by the chip 500.

Specifically, the material of the first cover cap 100 and the second cover cap 200 includes, but is not limited to, copper, aluminum, or copper-aluminum alloy.

It should be noted that in the electronic assembly, the chip 500 is located on the base plate 400, the shield 10 is located on the chip 500, the second cover cap 200 of the shield 10 makes contact with the chip 500, and the first cover cap 100 is located obliquely above the chip 500 and surrounds the chip 500. Since a number of times of refracting the electromagnetic radiation generated by operation of the chip 500 between the first cover cap 100 and the base plate 400 is inversely proportional to the distance L1 (shown in FIG. 1) from the surface of the first cover cap 100 close to the chip 500 to the surface of the second cover cap 200 close to the chip 500, the more the number of times of refracting the electromagnetic radiation is, the longer the distance L1 is, and the less the number of times of refracting the electromagnetic radiation is.

It should be noted that the distance L1 from the surface of the first cover cap 100 close to the chip to the surface of the second cover cap 200 close to the chip should not be too long or too short. In a case that the distance L1 from the surface of the first cover cap 100 close to the chip 500 to the surface of the second cover cap 200 close to the chip 500 is too long, the electromagnetic radiation generated by operation of the chip 500 is refracted less times between the first cover cap 100 and the base plate 400, such that less electromagnetic radiation in the refraction process is lost, more radiation energy of the electromagnetic radiation is coupled to the first cover cap 100, and then the electromagnetic shielding effect of the shield 10 is poor. The base plate 400 further includes electronic elements located on a side of the chip 500. The first cover cap 100 cover caps the electronic elements during mounting. In a case that the distance L1 is too short, the first cover cap 100 interferes with the electronic elements, resulting in that the shield 10 cannot be mounted in the electronic assembly. In the embodiment, the distance L1 from the surface of the first cover cap 100 close to the chip 500 to the surface of the second cover cap 200 close to the chip 500 is 0.8 mm-2 mm. For example, in other implementations, L1 is 1.2 mm, 1.5 mm, or 1.8 mm.

In the embodiment, since the distance from the surface of the first cover cap 100 close to the chip 500 to the surface of the second cover cap 200 close to the chip 500 is short, and the distance from the surface of the first cover cap 100 close to the chip 500 to the base plate 400 is short correspondingly, such that the electromagnetic radiation is refracted more times on the surface of the first cover cap 100, more electromagnetic radiation is lost in a refraction process, the radiation energy of the electromagnetic radiation coupled to the first cover cap 100 is reduced, and the radiation energy radiated out of the first cover cap 100 is reduced, such that the electromagnetic shielding effect of the shield 10 is desirable.

In the embodiment, a surface of the first cover cap 100 facing away from the chip 500 is an undulating surface 101. Compared with a case that the surface of the first cover cap facing away from the chip 500 is a flat surface, a heat dissipation area of the undulating surface 101 is larger, which is beneficial to increase in heat exchange between the first cover cap 100 and the outside, such that a heat dissipation effect of the shield 10 is improved, and a favorable temperature environment is provided for the chip 500 to work.

In the embodiment, a surface of the second cover cap 200 facing away from the chip 500 has a plurality of spaced fins 300. The fins 300 are of a high narrow type, and have a relatively large aspect ratio and a relatively large heat dissipation area, such that heat absorbed from the chip 500 can be quickly released, and a favorable temperature environment is provided for the chip 500 to work.

It should be noted that ends of the fins 300 protrude from the surface of the first cover cap 100. Compared with a case that the ends of the fins 300 are lower than the surface of the first cover cap, the ends of the fins 300 protrude from the surface of the first cover cap 100 in the embodiment of the disclosure, and the fins 300 are higher correspondingly, such that the heat exchange efficiency between the fins and the outside can be improved to facilitate the heat dissipation of the chip 500. In the embodiment, the fins 300 have a height of 3 mm-7 mm. For example, in other implementations, the fins 300 have a height of 3.2 mm, 4.7 mm, or 6.2 mm.

It should be noted that a space L2 between adjacent fins 300 (as shown in FIG. 1) should not be too long or too short. In a case that the space L2 is too long, the number of fins 300 that can be arranged on the surface of the second cover cap 200 decreases, and a sum of surface areas of all the fins 300 decreases, resulting in a smaller heat exchange area between the second cover cap 200 and the outside, which is unfavorable for heat dissipation of the chip 500. In a case that the space L2 is too short, heat between adjacent fins 300 is hard to take away, and a heat exchange effect is poor, which is also unfavorable for heat dissipation of the chip 500. In the embodiment, the space L2 between the adjacent fins 300 is 3 mm-6 mm. For example, in other implementations, L2 is 3.2 mm, 4.5 mm, or 5.8 mm.

In other embodiments, the space between the adjacent fins gradually increases in a direction from closer to the second cover cap to farther away from the second cover cap. That is to say, the space between tops of the adjacent fins is greater than the space between bottoms of the adjacent fins. Areas between the fins are open, which is beneficial to heat dissipation of the chip and to reduction in process difficulty of the fins.

In the embodiment, a plurality of chips 500 are provided on the base plate 400. A plurality of second cover caps 200 of the shield 10 are provided. One second cover cap 200 corresponds to one chip 500.

With reference to FIGS. 2 and 3, FIG. 2 is a schematic structural diagram of an electronic assembly according to an embodiment of the disclosure; and FIG. 3 is a schematic diagram of refraction of electromagnetic radiation in an electronic assembly according to an embodiment of the disclosure. The disclosure further provides an electronic assembly.

The electronic assembly includes: a base plate 400; a chip 500 located on the base plate 400; and the shield 10 located above the chip 500, where the first cover cap surrounds the chip 500, the second cover cap 200 is located directly above the chip 500, and the second cover cap 200 is closer to the chip 500 than the first cover cap 100 in a normal direction of the base plate 400.

In the electronic assembly provided in the embodiment of the disclosure, the chip 500 is located on the base plate 400; and the shield 10 is located above the chip 500, the first cover cap 100 surrounds the chip 500, the second cover cap 200 is located directly above the chip 500, and the second cover cap 200 is closer to the chip 500 than the first cover cap 100 in a normal direction of the base plate 400. The first cover cap 100 is connected to the peripheral sidewalls of the second cover cap 200, the first cover cap 100 surrounds the chip 500 for electromagnetic shielding, electromagnetic radiation is refracted on an inner surface of the first cover cap 100 for a plurality of times, energy of the electromagnetic radiation is lost in a refraction process (as shown in FIG. 3), radiation energy of electromagnetic radiation coupled to the first cover cap 100 is reduced, and radiation energy radiated out of the first cover cap 100 is reduced, such that an electromagnetic shielding effect of the shield 10 is desirable. Furthermore, the second cover cap 200 is closer to the chip 500 than the first cover cap 100, the second cover cap 200 makes contact with the chip 500 to absorb heat generated by operation of the chip 500, and since the first cover cap 100 is connected to the second cover cap 200, the first cover cap 100 can also absorb energy in the chip 500 correspondingly. In summary, under the action of the shield 10, the electronic assembly not only implements heat dissipation, but also performs electromagnetic shielding, which is conducive to a reduction in cost of the electronic assembly.

In the embodiment, an electronic device to which the electronic assembly is applied includes, but is not limited to, a television, a set-top box, a smart speaker, an IPC product, and a smart tablet.

In the embodiment, an edge of the base plate 400 has a fixing through hole for fixing the shield 10. In other embodiments, the base plate is a printed circuit board (PCB). The PCB includes: a pad configured to be connected to the chips; and a grounding point located at a periphery of the pad for grounding the shield 10.

In the embodiment, the chip includes, but is not limited to, a central processing unit (CPU) chip, a graphics processing unit (GPU) chip, and a double data rate synchronous dynamic random access memory (DDR) chip.

In the embodiment, the chip 500 and the base plate 400 are connected by means of a solder ball 600.

In the embodiment, an area of the second cover cap 200 is greater than that of the top of the chip 200, and a projection of the second cover cap 200 on the base plate 400 overlays a projection of the chip 500 on the base plate 400. Compared with a case that the projection of the second cover cap on the base plate is less than the projection of the chip on the base plate, the area of the second cover cap 200 for absorbing heat emitted by the chip 500 in the embodiment of the disclosure is greater, such that the heat generated by operation of the chip 500 can be conveniently absorbed by the second cover cap 200 above the chip 500, and a favorable temperature environment can be provided for the chip.

In the embodiment, the second cover cap 200 makes contact with the top of the chip 500, so as to quickly conduct heat from the chip 500 to the second cover cap 200. Specifically, the surface of the second cover cap 200 close to the chip 500 makes contact the top of the chip 500.

Specifically, the second cover cap 200 and the chip 500 are connected by insulating heat-conductive silicone grease. A gap between the chip 500 and the second cover cap 200 is filled with the heat-conductive silicone grease. The heat-conductive silicone grease is completely adhered to the chip, and the heat-conductive silicone grease is completely adhered to the second cover cap 200. Therefore, heat on the chip 500 can be more smoothly conducted to the second cover cap 200, and heat dissipation of the chip 500 is accelerated. The electronic assembly further includes electronic elements 502 located on the base plate 400 and arranged on a side of the chip 500 in a spaced manner. The first cover cap 100 cover caps the electronic elements 502 and makes contact with tops of the electronic elements.

Specifically, the surface of the first cover cap 100 close to the electronic elements 502 makes contact with tops of the electronic elements. Since the surface of the second cover cap 200 close to the chip 500 makes contact with the top of the chip 500, the distance from the surface of the first cover cap close to the chip to the surface of the second cover cap close to the chip is further shortened, the number of times of refracting the electromagnetic radiation between the first cover cap 100 and the base plate 400 is increased, the energy loss of the electromagnetic radiation is improved, the radiation energy of the electromagnetic radiation coupled to the first cover cap is reduced, and the electromagnetic shielding effect of the shield 10 is improved.

In the embodiment, the electronic elements 502 include, but are not limited to, capacitors or resistors.

It should be noted that the distance from the surface of the first cover cap 100 close to the chip 500 to the surface of the second cover cap 100 close to the chip 500 is short, which is beneficial to a reduction in a size of the electronic assembly and conformity to a trend of miniaturization of electronic devices.

The electronic assembly further includes a fastener 700 penetrating an edge of the shield 10 to fixedly connect the shield 10 to the base plate 400.

Specifically, the fastener 700 penetrates fixing the edge of the first cover cap 100 and a through hole in the base plate 400 to fix the shield 10 and the base plate 400 together.

In the embodiment, the fastener 700 includes a blocking portion 701, a shaft portion 702 located on an end surface of the blocking portion 701, and a radially extendable portion 703 located on an end surface of the shaft portion 702 facing away from the blocking portion 701. When the radially extendable portion 703 passes through the fixing through a hole, the radially extendable portion 703 is compressed by an edge of the fixing through a hole and radially contracts, such that the radially extendable portion 703 can pass through the fixing through a hole. After the radially extendable portion 703 passes through the fixing through a hole, the radially extendable portion 703 radially expands, such that a radial size of the radially extendable portion 703 is greater than a size of the fixing through a hole, and the radially extendable portion 703 can be clamped on a side of the base plate 400 facing away from the shield 10.

The electronic assembly further includes a spring 800 located between the first cover cap 100 and the blocking portion 701. After the fastener 700 fixes the shield 10 and the base plate 400 together, an elastic force provided by the spring 800 tightly connect the shield 10 to the base plate 400. In other embodiments, the fastener can also be a screw, and the base plate is provided with a threaded hole fastened to the screw.

In other embodiments, the electronic assembly further includes a grounding structure (not shown in the figures) located around the shield 10. One end of the grounding structure is connected to a periphery of the shield 10, and the other end of the grounding structure is connected to the base plate.

One end of the grounding structure is connected to the shield 10, and the other end thereof is connected to the base plate for grounding the shield 10, such that the chip 500 serving as an electromagnetic interference source can be shielded, and external electromagnetic intensity of the chip is lower than an allowable value. Alternatively, an electromagnetic sensitive circuit is sealed so as to prevent external electromagnetic waves from interfering with a relevant device to be protected and making an internal electromagnetic field intensity of the relevant device lower than an allowable value.

In the embodiment, the grounding structure is a bendable structure. Specifically, the grounding structure is an annular structure. The annular structure is circular, rectangular, rhombic, or irregular depending on an edge shape of the grounding structure. In the embodiment, one end of the grounding structure is connected to the sidewall of the first cover cap, and the other end of the grounding structure is connected to a grounding point on the base plate.

In the embodiment, a material of the grounding structure includes, but is not limited to, copper, aluminum, or copper-aluminum alloy.

The above description of the disclosed embodiments helps those skilled in the art to implement or use the disclosure. Various modifications to these embodiments will be readily apparent to those skilled in the art, and general principles defined herein may be implemented in other embodiments without departing from the spirit or scope of the disclosure. Thus, the disclosure is not to be limited to the embodiments shown herein but is to be accorded the widest scope consistent with the principles and novel features disclosed herein.

What is claimed is:

1. A shield applied to an electronic assembly, wherein the electronic assembly comprises a base plate and a chip located on the base plate, the shield is of a plate shape, and the shield comprises:

a first cover cap configured to surround the chip for electromagnetic shielding; and a second cover cap, wherein a peripheral sidewall of the second cover cap is connected directly to an end of the first cover cap, and the peripheral sidewall of the second cover cap directly protruding from a bottom surface of the first cover cap, such that the second cover cap is closer to the chip than the first cover cap in a normal direction of the base plate, and the second cover cap absorbs heat of the chip, wherein the first cover cap extends from the end of the first cover cap in a lateral direction perpendicular to the normal direction, the first cover cap extending from the end away from the chip in the lateral direction.

2. The shield according to claim 1, wherein a distance from the bottom surface of the first cover cap close to the chip to a surface of the second cover cap close to the chip is 0.8 mm-2 mm.

3. The shield according to claim 1, wherein a top surface of the first cover cap facing away from the chip is an undulating surface, the undulating surface positioned outside of a periphery of the chip along the lateral direction.

4. The shield according to claim 1, wherein a surface of the second cover cap facing away from the chip has a plurality of spaced fins connected directly to the surface of the second cover cap.

5. The shield according to claim 4, wherein an end of at least one fin of the plurality of spaced fins protrudes from a top surface of the first cover cap at the end of the first cover cap.

6. The shield according to claim 4, wherein a space between adjacent fins is 3 mm-6 mm.

7. The shield according to claim 4, wherein in a direction perpendicular to an extending direction of the fins as the lateral direction, lateral sizes of the fins decrease in a direction away from the second cover cap.

8. The shield according to claim 1, wherein the first cover cap is a flat plate, and distances from all portions of a bottom of the first cover cap to a bottom of the second cover cap are the same; or, the first cover cap is an undulating plate, and distances from all portions of a bottom of the first cover cap to a bottom of the second cover cap are different.

9. The shield according to claim 1, wherein the second cover cap is square, rectangular or circular, and the first cover cap is located on the peripheral sidewall of a top of the second cover cap.

10. The shield according to claim 1, wherein a plurality of chips are provided on the base plate; and a plurality of second cover caps of the shield are provided.

11. An electronic assembly, comprising:

a base plate;

a chip located on the base plate; and the shield according to claim 1 located above the chip, wherein the first cover cap surrounds the chip, the second cover cap is located directly above the chip, and the second cover cap is closer to the chip than the first cover cap in a normal direction of the base plate.

12. The electronic assembly according to claim 11, wherein a projection of the second cover cap on the base plate overlays a projection of the chip on the base plate.

13. The electronic assembly according to claim 11, further comprising a grounding structure located around the shield, wherein one end of the grounding structure is connected to a periphery of the shield, and the other end of the grounding structure is connected to the base plate.

14. The electronic assembly according to claim 11, further comprising: a fixing member penetrating an edge of the shield to fixedly connect the shield to the base plate.

15. The electronic assembly according to claim 11, wherein the second cover cap makes direct contact with a top of the chip.

16. The electronic assembly according to claim 11, further comprising: electronic elements located on the base plate and arranged on a side of the chip in a spaced manner, wherein the first cover cap covers the electronic elements and makes contact with tops of the electronic elements.

17. A shield applied to an electronic assembly, wherein the electronic assembly comprises a base plate and a chip located on the base plate, the shield is of a plate shape, and the shield comprises:

a first cover cap configured to surround the chip for electromagnetic shielding; and a second cover cap, wherein a peripheral sidewall of the second cover cap is connected the first cover cap, and the peripheral sidewall of the second cover cap protruding from a bottom surface of the first cover cap, such that the second cover cap is closer to the chip than the first cover cap in a normal direction of the base plate, and the second cover cap absorbs heat of the chip, wherein the first cover cap extends from the peripheral sidewall of the second cover cap in a lateral direction perpendicular to the normal direction, the first cover cap extending from the peripheral sidewall away from the chip without being over the chip.

18. The shield according to claim 17, wherein a top surface of the first cover cap facing away from the chip is an undulating surface, the undulating surface positioned outside of a periphery of the chip along the lateral direction.

19. The shield according to claim 17, wherein an end of a fin for dissipating heat protrudes from a top surface of the first cover cap where the peripheral sidewall of the second cover cap is connected to the first cover cap.

20. The shield according to claim 17, wherein a surface of the second cover cap facing away from the chip has a plurality of spaced fins.

* * * * *